United States Patent [19] [11] Patent Number: 4,814,872
Ivie [45] Date of Patent: Mar. 21, 1989

[54] DIGITAL VIDEO PROBE SYSTEM
[75] Inventor: Frank M. Ivie, Portland, Oreg.
[73] Assignee: Tektronix, Inc., Beaverton, Oreg.
[21] Appl. No.: 58,094
[22] Filed: Jun. 4, 1987
[51] Int. Cl.$^4$ .......................................... H04N 17/04
[52] U.S. Cl. ................................. 358/139; 324/73 R
[58] Field of Search ................. 358/139, 159, 10, 149, 358/158; 324/73 R; 371/20, 29

[56] References Cited
U.S. PATENT DOCUMENTS

| | | | |
|---|---|---|---|
| 4,408,226 | 10/1983 | Dean et al. ........................... | 358/139 |
| 4,554,663 | 11/1985 | Pham van Cang ............. | 358/139 X |
| 4,677,620 | 6/1987 | Sutton et al. .................. | 324/73 R X |
| 4,752,825 | 6/1988 | Buckley et al. ..................... | 358/139 |

Primary Examiner—James J. Groody
Assistant Examiner—Victor R. Kostak
Attorney, Agent, or Firm—Francis I. Gray

[57] ABSTRACT

A digital video probe system has a digital data probe for attachment to a data test point and a digital clock probe for attachment to a clock test point of a device under test. A clock signal from the clock test point is variably phase shifted by changing the duty cycle of the clock signal to produce a variable clock signal for processing digital data from the data test point. The processed digital data is converted to an analog video signal and displayed on an appropriate analog monitor. By varying horizontal and vertical sync inputs to the analog monitor the displayed signal may be moved about the display to assure that all of the processed digital data is displayed.

8 Claims, 3 Drawing Sheets

DIGITAL VIDEO PROBE SYSTEM

BACKGROUND OF THE INVENTION

The present invention relates to digital analysis of the operation of devices, and more particularly to a digital video probe for retrieving digital data from a device under test and displaying the data in analog form.

With the increasing amount of digital video equipment being introduced into broadcasting systems, particularly into critical program paths as well as for "special effects" applications, it is important to have means for quickly identifying and repairing faulty equipment. However, although digital equipment is stable and reliable, the signal paths can be quite complex and the digital implementation of some functions, such as filtering, can appear more complicated than the analog equivalent. Also the multi-bit structure can make signal tracing more difficult. In a broadcast television studio it is important that any equipment failures be identified quickly and the offending equipment be repaired or replaced in a minimum amount of time to prevent a loss of air time. To do this a simple to use failure detection instrument is necessary since generally such first-line service will be performed by persons unfamiliar with the details of the equipment operation.

Typical analog troubleshooting involves signal tracing by observing the waveform at various points of a device under test on an oscilloscope. By testing at various points along a signal path the location of a fault can be isolated by observing where the signal deviates from the expected waveform. However in a digital system the signal waveform may not indicate the nature of the fault. It has been suggested by D. J. Bradshaw in "Fault Diagnosis in Digital Video Equipment", EBU Review - Technical No. 214, December 1985, that the digital signals be converted to an analog waveform by a digital to analog converter (DAC) and displayed using an oscilloscope or a picture monitor. Alternatively signature analysis has been proposed as a preferred technique to provide "signal tracing" fault analysis, but such a fault diagnosis technique would have to be designed into the circuit which would add to the expense of the digital equipment.

What is desired is a simple to use fault diagnosis instrument for use with digital equipment for providing initial fault diagnosis without the need for designing special circuitry into the digital equipment.

SUMMARY OF THE INVENTION

Accordingly the present invention provides a digital video probe system for fault analysis of digital equipment. A digital data probe and a clock probe are attached to respective test points of a device under test. The data from the digital data probe are level shifted and latched by a clock signal from the clock probe. The data is subsequently converted to analog and displayed on an analog display, such as a picture monitor, waveform monitor, oscilloscope or the like. The clock signal is controlled by altering its duty cycle to vary the timing of the rising and falling edges to ensure accurate, glitch free latching of the digital data from the digital data probe. A sync portion provides a variable sync output to allow horizontal and vertical positioning of the resulting analog data on a picture monitor so that data that would otherwise be off screen may be observed.

The objects, advantages and other novel features of the present invention will be apparent from the following detailed description when read in conjunction with the appended claims and attached drawing.

DESCRIPTION OF THE PREFERRED EMBODIMENT

Figure 1:
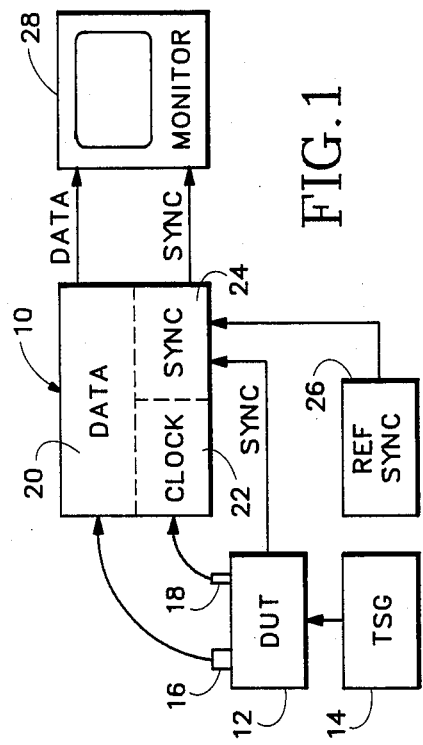
FIG. 1 is a block diagram view of a failure analysis system using the present invention.

Referring now to FIG. 1 a digital analysis probe system 10 according to the present invention is shown as part of a failure analysis system. A device under test (DUT) 12 has a signal from a test signal generator (TSG) 14 or the like applied to it. A data probe 16 and a clock probe 18 are attached to selected respective test points of the DUT 12. The outputs from the data probe and the clock probe are input respectively to a data section 20 and a clock section of the digital analysis probe system 10. The digital analysis probe system 10 also has a sync section 24 to which is input a sync signal, either from the DUT 12 or from a reference sync source 26, such as a television studio master sync generator. The data output from the data section 20 is input to a picture monitor 28 together with a sync signal from the sync section 24. Since the data section 20 passes the data straight through without any appreciable delay, the sync output from the sync section 24 is varied to enable the display on the picture monitor 28 to be moved vertically and horizontally so that all of the data can be seen, including the blanking intervals.

Figure 2:
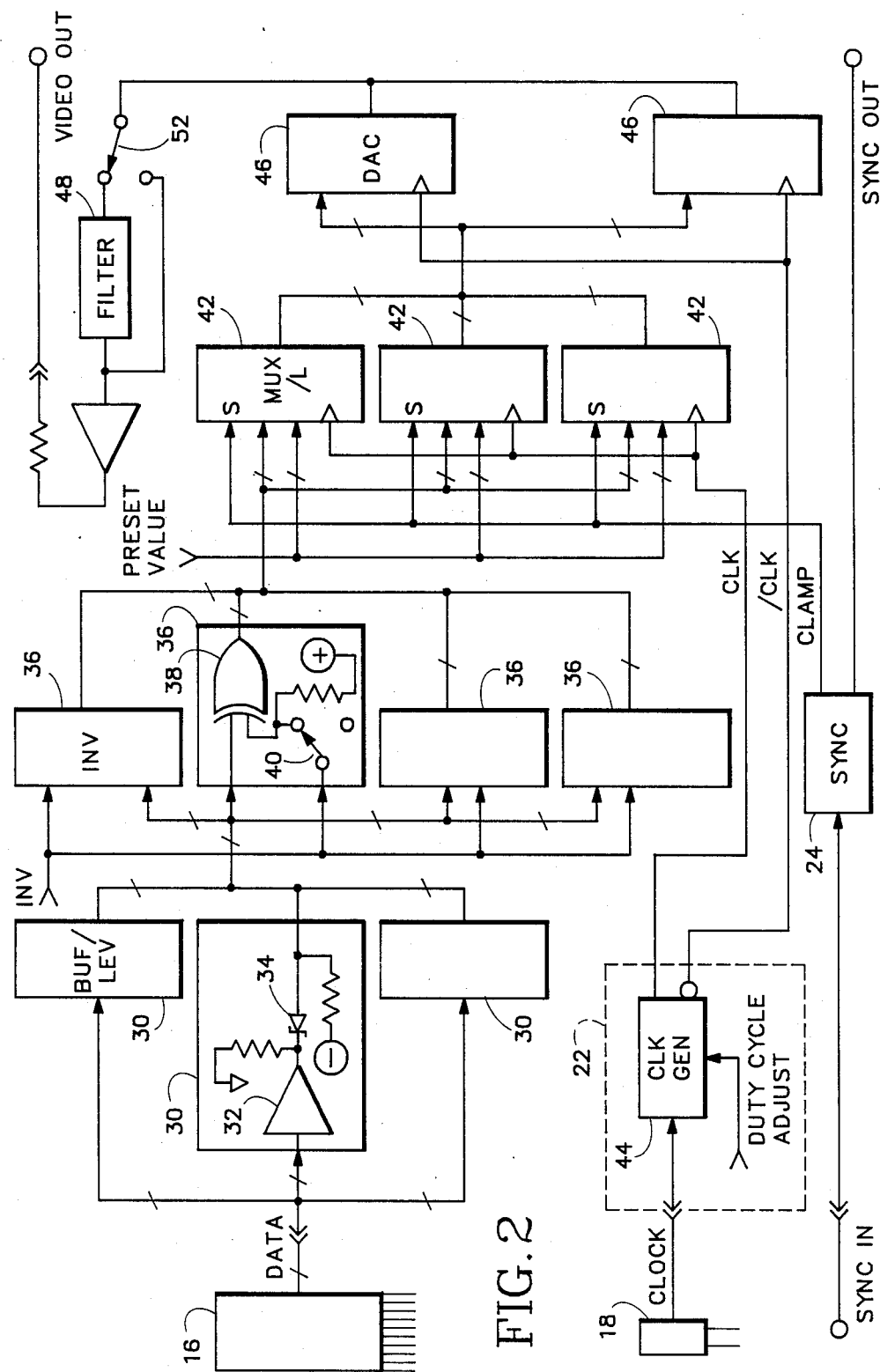
FIG. 2 is a block diagram view of the basic architecture of a digital analysis probe system according to the present invention.

As shown in FIG. 2 the data from the data probe 16 is input to a buffer/level shifting circuit 30, typically consisting of an amplifier 32 in series with a zener diode 34 with appropriate reference levels. The outputs of the buffer/level shifting circuit 30 are input to an inverter circuit 36 which allows for inversion of some or all of the input data. For example, the inverter circuit 36 may have an exclusive OR gate 38 with the data from the buffer/level shifting circuit 30 as one input and an invert signal via a switch 40 as a second input. If the switch 40 is set in one position, the invert signal causes the output of the exclusive OR gate 38 to be an inverted version of the data, and if the switch is set in a second position, the invert signal has no effect. By presetting the switches 40, such as standard DIP switches, an operator can determine which data input lines will be inverted by the invert signal. The outputs from the inverter circuits 36 are input to combination multiplexer/latch circuits 42.

A clock signal from the clock probe 18 is input to a clock generator 44 which outputs a variable duty cycle clock signal according to a duty cycle adjust signal input by the operator. The effect of changing the duty cycle is to change the clock phase for the leading and trailing edges. The clock signal is used to latch the data from the inverter circuits 36 into the multiplexer/latch circuits 42 and is delayed by the duty cycle adjust signal to assure that there is no ambiguity in the data being latched. An inverted clock signal from the clock generator 44 is also used to clock a digital to analog converter (DAC) 46 which converts the output from the multiplexer/latch circuit 42 into an analog video output signal. The multiplexer/latch circuit 42 is switched by a clamp signal from the sync section 24 when variable sync is selected to provide a reference level at the output during the normal burst interval of a composite sync signal, the reference level typically being zero volts. The analog video output signal is either input via a lowpass filter 48 to an output amplifier 50 or is input directly to the output amplifier via a switch 52. The analog video output signal from the output amplifier 50 is input to the monitor 28 for display.

Figure 3:
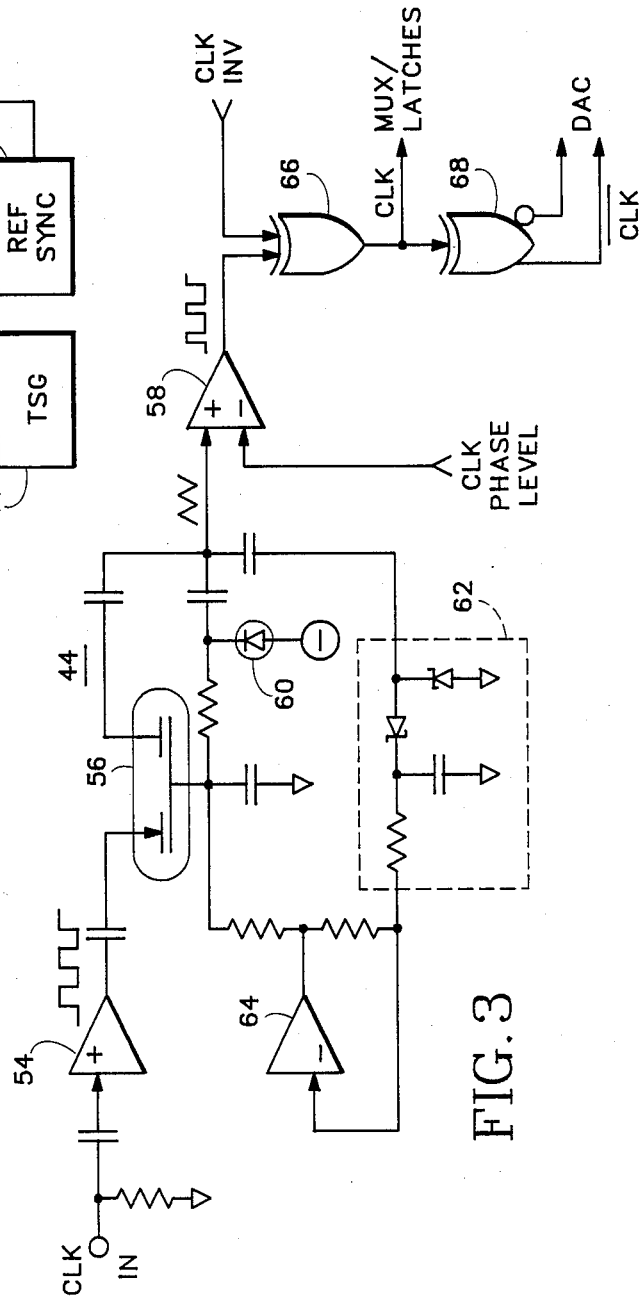
FIG. 3 is a schematic diagram view of a clock circuit for the digital analysis probe system of the present invention.

The clock signal from the DUT 12 via clock probe 18 is input to an input amplifier 54 as shown in FIG. 3. The clock signal is generally in the form of a square wave having a fifty percent duty cycle. The output of the amplifier 54 provides an input to an FET 56 which acts as a variable resistor. The output of the FET 56 is a triangular wave clock signal which is input to a comparator 58. A varactor diode 60 in the output portion of the FET 56 circuit serves as a variable capacitor. A portion of the triangular output clock signal is fed back to a peak detector circuit 62, the output of which is input to a feedback amplifier 64. The output of the feedback amplifier 64 serves to automatically adjust the slope of the triangular clock output by changing the resistance of the FET 56 and the capacitance of the varactor diode 60, thus assuring that, regardless of the frequency of the input clock signal from the DUT 12, the triangular clock signal has fixed amplitude limits. A clock phase level signal controlled by the operator is input to the other input of the comparator 58. The resulting output of the comparator 58 is a variable duty cycle clock signal, the duty cycle being a function of the clock phase level signal. The clock output from the comparator 58 is input to an exclusive OR gate 66 to which also is input a clock invert signal controlled by the operator. The final clock output CLK from the exclusive OR gate 66 is used to clock the multiplexer/latch circuit 42. CLK is also input to another exclusive OR gate 68 which acts as an inverter to provide a /CLK signal for the DAC 46 in the form of a differential pair. Using /CLK for the DAC 46 also serves to assure no data ambiguities in the conversion process.

Figure 4:
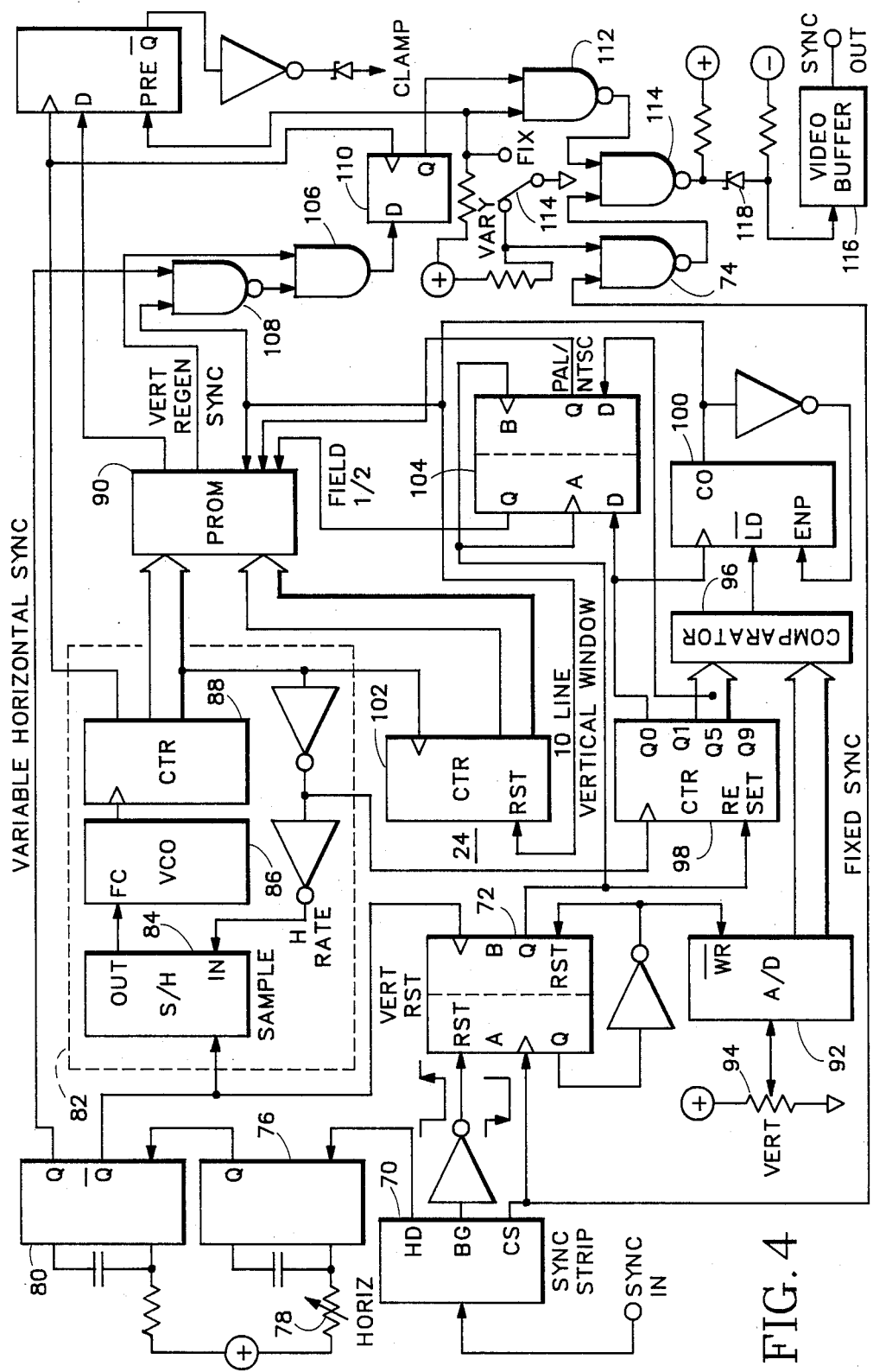
FIG. 4 is a schematic diagram view of a variable sync circuit for the digital analysis probe system of the present invention.

Referring now to FIG. 4 a video sync signal, either from the DUT 12 or the reference sync source 26, is input to a sync stripper 70 which produces a composite sync output CS, a horizontal sync output HD and a burst gate output BG. The composite sync CS is input to a vertical reset circuit 72 as a clock signal and to a fixed sync NAND gate 74. The horizontal sync HD is input to a first one-shot multivibrator 76 where the output pulse width is determined by a variable resistor 78 controlled by the operator. The output of the first one-shot 76 is input to a second one-shot 80 which has a fixed pulse width output. Since the second one-shot 80 triggers off the trailing edge of the output of the first one-shot 76, the output of the second one-shot is a delayed horizontal sync, the amount of the delay being a function of the variable resistor 78. A clock phase lock loop circuit 82 has an input sample/hold circuit 84 in series with a voltage controlled oscillator (VCO) 86. The output of the VCO 86 is counted by a counter 88, and a portion of the counter output at the horizontal sync rate is fed back as the input to the sample/hold circuit 84. The inverted delayed horizontal sync pulse provides the sample input to the sample/hold circuit 84. The resulting output of the sample/hold circuit 84 serves to control the frequency of the VCO 86. The inverted delayed horizontal sync pulse is also input to a second half of the vertical reset circuit 72 as a clock input. The output of the counter 88 serves as a portion of an address for a programmable read only memory (PROM) 90.

The A side of the vertical reset circuit 72 acts as a vertical sync detector. The burst gate BG is present during all horizontal lines except the vertical interval. The A side acts as a counter which counts the sync pulses of CS and which is reset by BG. During the vertical interval there is no BG so that the A side outputs a count which resets the B side of the vertical reset circuit 72 and enables the output of a analog to digital converter (ADC) 92. The input to the ADC 92 is a variable voltage from variable resistor 94 which is used to control vertical movement of the display on the picture monitor 28. The digitized vertical value is input to a vertical comparator 96. The output of the B side of the vertical reset circuit 72 resets a counter 98 at the beginning of the vertical interval of the input sync. The output of the counter 98 is compared to the variable vertical signal from the ADC 92 in the comparator 96. The output of the comparator 96 starts the counting of a decade counter 100 which outputs a vertical window pulse which is ten horizontal lines wide. The vertical window pulse is input to the reset of an address counter 102 which provides additional address lines for the PROM 90, and also is input as an address line directly to the PROM.

A final detector 104 has an A side which determines the field of the data based upon the phase reversal between phases, i.e., whether a whole line occurs between the last horizontal sync pulse of the previous field and the first equalizing pulse of the vertical interval. The B side of the final detector 104 is used to determine whether an NTSC or PAL signal is being input since there are a different number of horizontal lines per field between the two systems. The two output lines from the final detector 104 are input as the final address bits for the PROM 90. The outputs from the PROM 90 are a regenerated vertical sync and a burst blanking signal. The regenerated vertical sync is input to an AND gate 106. The other input to AND gate 106 is from NAND gate 108. The output of NAND gate 108 is a logical one during the ten line vertical window and is the variable horizontal sync signal otherwise the output of the AND gate is the combination of the regenerated vertical sync during the vertical window and the variable horizontal sync outside the vertical window. The reconstituted composite sync from AND gate 106 is input to a sync latch 110, the output of which is an input to a variable NAND gate 112. A switch 114 determines whether the fixed sync NAND gate 74 or the variable NAND gate 112 is enabled for output. The two NAND gates 74, 112 are input to an output NAND gate 114, the output of which is input to a video buffer 116. A zener diode 118 between the output NAND gate 114 and the video buffer 116 provides a level adjustment. The output of the video buffer 116 provides the output sync for the picture monitor 28.

Thus the present invention provides a digital video probe system which uses separate data and clock probes to sample test points in a device under test, varies the duty cycle of the clock signal from the clock probe to assure unambiguous processing of the data from the data probe, converts the data to analog using the variable clock signal, and provides a variable sync so that the displayed video may be moved horizontally and vertically on a picture monitor.

What is claimed is:

1. A digital video probe system comprising:
   a digital data probe for attachment to a data test point of a digital device under test;
   a digital clock probe for attachment to a clock test point of the digital device under test;
   means for varying the phase of a clock signal from the digital clock probe to produce a variable clock signal; and
   means for converting digital data from the digital data probe into an analog video signal for display on an analog monitor, the converting means being clocked by the variable clock signal.

2. A digital video probe system as recited in claim 1 further comprising means for varying an input sync signal to produce a variable sync signal to control the positioning of the analog video signal on the analog monitor.

3. A digital video probe system as recited in claim 1 wherein the varying means comprises:
   means for converting the clock signal to a triangular clock waveform having a constant amplitude; and
   means for comparing the triangular clock waveform with a variable input clock phase level to produce the variable clock signal 4. A digital video probe system as recited in claim 1 further comprising means for inverting the variable clock signal.

5. A digital video probe system as recited in claim 3 further comprising means for automatically maintaining the constant amplitude of the triangular clock waveform regardless of the frequency of the clock signal.

6. A digital video probe system as recited in claim 5 wherein the clock signal converting means comprises:
   an FET circuit having an output filter with a large time constant relative to the frequency of the clock signal, the clock signal being input to the FET circuit and the triangular clock signal being output from the FET circuit.

7. A digital video probe system as recited in claim 6 wherein the maintaining means comprises:
   a voltage controlled variable capacitor in the output filter;
   means for detecting the peaks of the triangular clock signal; and
   means for feeding back the detected peaks as a voltage level to the voltage controlled variable capacitor so that the amplitude of the triangular clock signal remains constant.

8. A digital video probe system as recited in claim 2 wherein the sync varying means comprises:
   means for variably delaying a horizontal sync component of the input sync signal;
   means for detecting a vertical sync component of the input sync signal;
   means for counting the number of pulses of the delayed horizontal sync component after the vertical sync component is detected;
   means for generating a variable input control count;
   means for comparing the count of the counting means with the variable input control count to produce a variable vertical sync interval;
   means for regenerating a vertical sync signal during the variable vertical sync interval; and
   means for combining the regenerated vertical sync signal with the variably delayed horizontal sync component to produce the variable sync output signal.

* * * * *